United States Patent
Tong et al.

(10) Patent No.: US 9,097,762 B2
(45) Date of Patent: Aug. 4, 2015

(54) METHOD AND APPARATUS FOR DIAGNOSING AN INTEGRATED CIRCUIT

(71) Applicant: Taiwan Semiconductor Manufacturing Company, Ltd., Hsin-Chu (TW)

(72) Inventors: Kin Lam Tong, Hsin-Chu (TW); Wei-Pin Changchien, Taichung (TW); Chin-Chou Liu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/942,947

(22) Filed: Jul. 16, 2013

(65) Prior Publication Data

US 2013/0305112 A1    Nov. 14, 2013

Related U.S. Application Data

(62) Division of application No. 12/628,725, filed on Dec. 1, 2009, now Pat. No. 8,516,316.

(60) Provisional application No. 61/163,543, filed on Mar. 26, 2009.

(51) Int. Cl.
*G01R 31/3177*    (2006.01)
*G01R 31/3185*    (2006.01)

(52) U.S. Cl.
CPC .... *G01R 31/3177* (2013.01); *G01R 31/318541* (2013.01); *G01R 31/318566* (2013.01)

(58) Field of Classification Search
CPC .................. G01R 31/318541; G01R 31/3177; G01R 31/318566
USPC ................................. 714/726, 727, 733, 736
See application file for complete search history.

(56) References Cited

U.S. PATENT DOCUMENTS

| | | | |
|---|---|---|---|
| 5,155,432 A * | 10/1992 | Mahoney | 324/762.02 |
| 5,175,447 A | 12/1992 | Kawasaki et al. | |
| 5,535,222 A | 7/1996 | Le | |
| 5,606,565 A | 2/1997 | Edler et al. | |
| 6,470,468 B1 | 10/2002 | Fukui | |
| 6,490,702 B1 * | 12/2002 | Song et al. | 714/726 |
| 6,671,839 B1 * | 12/2003 | Cote et al. | 714/726 |
| 6,671,847 B1 | 12/2003 | Chao et al. | |
| 6,745,359 B2 * | 6/2004 | Nadeau-Dostie | 714/726 |
| 6,895,540 B2 | 5/2005 | Chen et al. | |

(Continued)

OTHER PUBLICATIONS

Wang, Fei; Yu Hu; Yu Huang; Jing Ye; Xiaowei Li, "Observation Point Oriented Deterministic Diagnosis Pattern Generation (DDPG) for Chain Diagnosis," Asian Test Symposium, 2008. ATS '08. 17th , vol., No., pp. 185,190, Nov. 24-27, 2008.*

Benware, B.; Mrugalski, G.; Pogiel, A.; Rajski, J.; Solecki, J.; Tyszer, J., "Diagnosis of failing scan cells through orthogonal response compaction," Test Symposium (ETS), 2010 15th IEEE European , vol., No., pp. 221,226, May 24-28, 2010.*

(Continued)

*Primary Examiner* — Cynthia Britt
(74) *Attorney, Agent, or Firm* — Slater & Matsil, L.L.P.

(57) ABSTRACT

System and method for diagnosing failures within an integrated circuit is provided. In an embodiment, the apparatus includes a diagnostic cell coupled in series with a buffer chain. The diagnostic cell includes a plurality of logic operators that when activated invert a signal received from the buffer chain. The inversion of the signal from the buffer chain allows the diagnostic cell to determine the location of a failure within an integrated circuit previously determined by a scan chain design for test methodology to contain a failure.

20 Claims, 7 Drawing Sheets

(56) References Cited

U.S. PATENT DOCUMENTS

| | | | |
|---|---|---|---|
| 7,373,568 B1 | 5/2008 | Horovitz | |
| 7,516,379 B2 | 4/2009 | Rohrbaugh et al. | |
| 7,543,203 B2 | 6/2009 | Ashton et al. | |
| 7,827,454 B2 | 11/2010 | Kurimoto | |
| 7,913,131 B2 | 3/2011 | McLaurin | |
| 7,996,741 B2 * | 8/2011 | Touba et al. | 714/732 |
| 8,516,316 B2 * | 8/2013 | Lam et al. | 714/726 |
| 2008/0092003 A1 * | 4/2008 | Khoche et al. | 714/733 |

OTHER PUBLICATIONS

Jing Ye; Yu Huang; Yu Hu; Wu-Tung Cheng; Ruifeng Guo; Liyang Lai; Ting-Pu Tai; Xiaowei Li; Weipin Changchien; Daw-Ming Lee; Ji-Jan Chen; Eruvathi, S.C.; Kumara, K.K.; Liu, C.; Sam Pan, "Diagnosis and Layout Aware (DLA) scan chain stitching," Test Conference (ITC), 2013 IEEE International , vol., No., pp. 1,10, Sep. 6-13, 2013.*

* cited by examiner

Fig. 1

Diagnostic Cell Truth Table

| Diagnostic Enable Signal | Control Signal | First Logic Operator Output Signal | Buffer Chain Signal | Diagnostic Signal |
|---|---|---|---|---|
| Disable | Do Not Invert | Do Not Invert | 0 | 0 |
| Disable | Do Not Invert | Do Not Invert | 1 | 1 |
| Disable | Invert | Do Not Invert | 0 | 0 |
| Disable | Invert | Do Not Invert | 1 | 1 |
| Enable | Do Not Invert | Do Not Invert | 0 | 0 |
| Enable | Do Not Invert | Do Not Invert | 1 | 1 |
| Enable | Invert | Invert | 0 | 1 |
| Enable | Invert | Invert | 1 | 0 |

Bypass (rows 1-6) / Invert (rows 7-8)

METHOD AND APPARATUS FOR DIAGNOSING AN INTEGRATED CIRCUIT

This application claims the benefit of U.S. application Ser. No. 12/628,725, filed on Dec. 1, 2009, entitled "Method and Apparatus for Diagnosing an Integrated Circuit," which application is hereby incorporated by reference.

TECHNICAL FIELD

The present invention relates generally to a system and method for integrated circuit failure analysis and, more particularly, to a system and method for locating a failure in an integrated circuit that has been identified by a scan chain test.

BACKGROUND

Modern circuit designs incorporate methods and hardware that enable testing of an integrated circuit (IC) upon completion of production. Circuit designers refer to this as design for test (DFT) or design for testability. Upon completion of the IC product, IC testers apply manufacturing tests utilizing the methods and hardware included in the DFT design process. In this manner, IC testers validate that the IC hardware contains no defects that could prevent the IC from functioning as intended.

One DFT technique utilizes scan chains. Scan chains provide a simple way to set and observe every flip-flop in an IC. In order to utilize a scan chain, designers add a special signal called scan enable to an IC design. When the testing process asserts the scan enable signal, every flip-flop in the design connects into a long shift register or scan chain. One input pin provides data to this scan chain, and one output pin connects to the output of the scan chain. Using the chip's clock signal, a pre-determined pattern is entered into the chain of flip-flops, and upon completion of the test, a testing module reads out the state of every flip-flop.

The patterns entered into a scan chain are called test patterns. The state of every flip-flop upon completion of the test is generally referred to as the results or resultant pattern of the test. The testing system compares the results shifted out from the output pins against the expected "good machine" results. Good machine results are the bit patterns that are expected when the IC performed properly. In the event that the results pattern matches or compares to the good machine pattern, the IC performed in the designed manner. In the event that the good machine pattern does not match or miscompares, the IC did not perform in the designed manner, i.e., failed. When an IC test has failed, the unit conducting the test reports that a problem has been found with the IC.

Utilization of scan chains within an IC increases testability and the ability to observe the IC. However, while the scan chain diagnostic method determines when an IC has failed, scan chain diagnostics suffer particular problems when the failure occurs within a delay/buffer chain between flip-flops. Therefore, there is a need for a system and/or method for diagnosing failures within an IC that generally locates the failure and more particularly locates the failures that occur within a delay/buffer chain.

These and other problems are generally solved or circumvented, and technical advantages are generally achieved, by illustrative embodiments of the present invention which provide an apparatus for locating a failure within an integrated circuit, and a method for using the same.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently illustrated embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
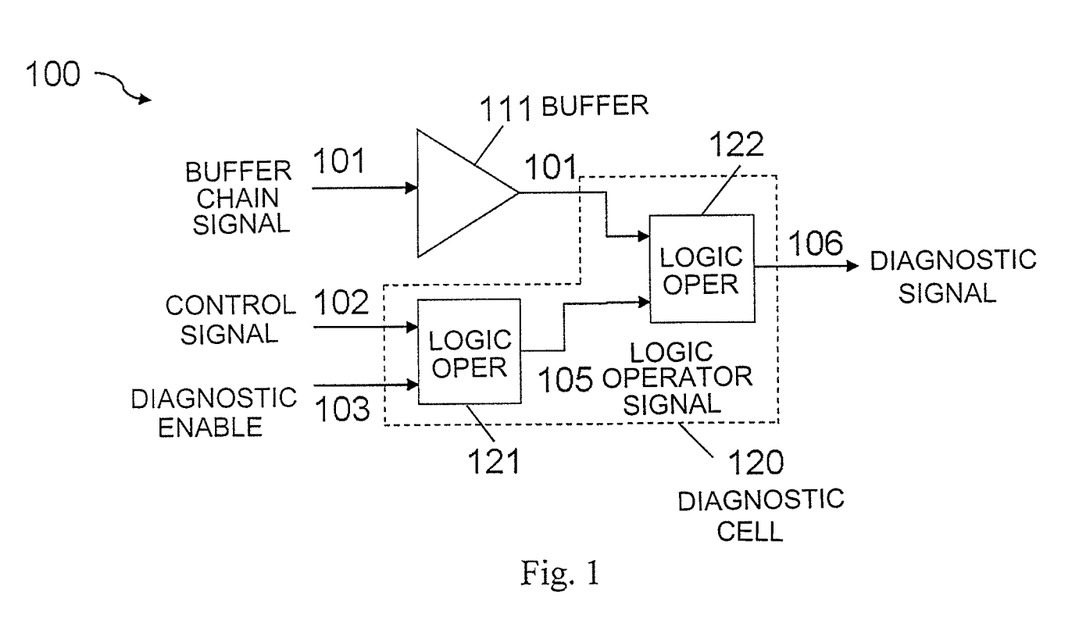
FIG. 1 is a schematic diagram of a diagnostic cell in accordance with an embodiment of the present invention.

With reference now to FIG. 1, there is shown a schematic diagram illustrating a system 100 for diagnosing an integrated circuit (IC). System 100 comprises a buffer 111 and a diagnosis cell 120. The buffer 111 comprises a logic operator of a buffer type normally situated between flip-flops in a circuit in order to drive the signal to the next element in the circuit. The buffer 111 may also delay a signal while other operations are conducted in order to keep elements within a circuit synchronous. The buffer 111 receives a buffer chain signal 101 and transmits the buffer chain signal 101 to the next element in the system.

The diagnosis cell 120 receives the buffer chain signal 101, a control signal 102 and a diagnostic enable signal 103, and in response, the diagnosis cell 120 transmits a diagnostic signal 106. The control signal 102 comprises a signal instructing the diagnostic cell to invert or not invert the buffer chain signal 101. The control signal 102 may be received from a flip-flop within the system or from a primary input. Tying the control signal 102 to a flip-flop allows a tester to select inversion as part of the test pattern entered into the scan chain. A person of ordinary skill in the art will recognize that this value may be set before the test is run or selected in the event the system fails the initial scan chain test.

The diagnostic enable signal 103 comprises an enable value or a disable value set by the user such that a user may enable or disable the diagnosis cell 120 as necessary to diagnose failures within the system. Alternatively, the diagnostic enable signal 103 could be set automatically by test equipment. The diagnosis cell 120 comprises logic operators such that when the diagnostic cell 120 is enabled, the diagnostic signal 106 will comprise a value that is the inverse of the buffer chain signal 101, produced according to the diagnostic cell truth table of FIG. 2. For example, where the control signal 102 comprises an invert value, and the diagnostic enable signal 103 comprises an enable value, the diagnostic signal 106 will be the inverse of the buffer chain signal 101.

In the illustrated embodiment, the diagnosis cell 120 further comprises a first logic operator 121 and a second logic operator 122. The first logic operator 121 receives the control signal 102 and the diagnostic enable signal 103 and transmits the first logic operator signal 105. The first logic operator 121 comprises one or more logic operators such that the first logic operator 121 will produce a first logic operator signal 105 according to the diagnostic cell truth table of FIG. 2. For example, where the control signal 102 comprises an invert value, and the diagnostic enable signal 103 comprises an enable value, the first logic operator signal 105 produced by the first logic operator 121 will comprises an invert value.

The second logic operator 122 receives the buffer chain signal 101 and the first logic operator signal 105 and produces the diagnostic signal 106 in response. The second logic operator 122 comprises one or more logic operators such that the second logic operator 122 will produce the diagnostic signal 106 according to the diagnostic cell truth table of FIG. 2. A person of ordinary skill in the art will understand that the first logic operator 121 and the second logic operator 122 may comprise any logic elements that, with equivalent inputs, produce a diagnostic signal 106 equivalent to that illustrated in the diagnostic cell truth table of FIG. 2. In addition, the first logic operator 121 and the second logic operator 122 may comprise a single logic element or a plurality of logic elements, so long as the result of the logic operations produces an equivalent result.

In an exemplary operative embodiment, when the diagnostic enable signal 103 comprises a disable value, the diagnosis cell 120 allows the buffer chain signal 101 to pass through, such that the diagnostic signal 106 is equivalent to the buffer chain signal 101. When the diagnostic enable signal 103 comprises an enable value, the diagnosis cell 120 allows a user to invert the value of the buffer chain signal 106 based on the control signal 102. In this manner, a user may determine where a failure has occurred within an IC. For example, in the event that a scan chain test has identified a failure in the circuit, inverting the buffer chain signal 101 identifies whether the failure occurred before or after the diagnostic cell 120. In the event that an inversion of the buffer chain signal 101 corrects the resultant pattern in a subsequent scan chain test then the failure is located before the diagnostic cell 120. In the event that an inversion does not correct the resultant pattern in a subsequent scan chain test, the failure is located after the diagnostic cell 120.

Figure 2:
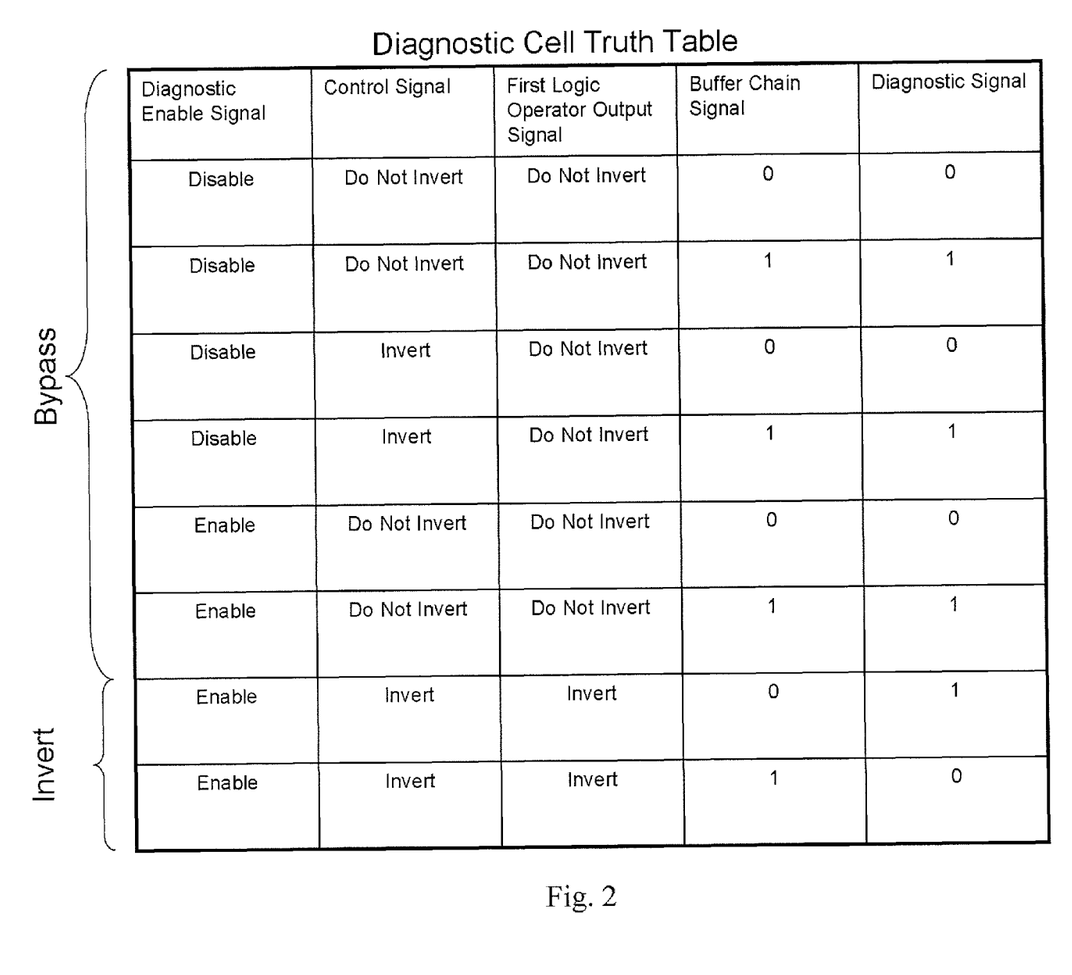
FIG. 2 is a truth table corresponding to the diagnostic cell embodiment of the present invention illustrated in FIG. 1.

Referring now to FIG. 2, there is shown a truth table for the diagnostic cell 120 of FIG. 1. When the diagnostic enable signal 103 comprises a disable value, the diagnostic cell 120 bypasses the buffer chain signal 101, i.e., passes the buffer chain signal through unchanged. Similarly, when the control signal 102 comprises a do not invert value, the diagnostic cell 120 bypasses the buffer chain signal 101. As illustrated in FIG. 2, when the diagnostic cell 120 bypasses the buffer chain signal 101, the diagnostic signal 106 comprises a value equivalent to the buffer chain signal 101. When the diagnostic enable signal 103 comprises an enable value, and the control signal 102 comprises an invert value, the diagnostic cell 120 inverts the buffer chain signal 101, thus the diagnostic signal 106 comprises the inverse value of the buffer chain signal 101.

Figure 3:
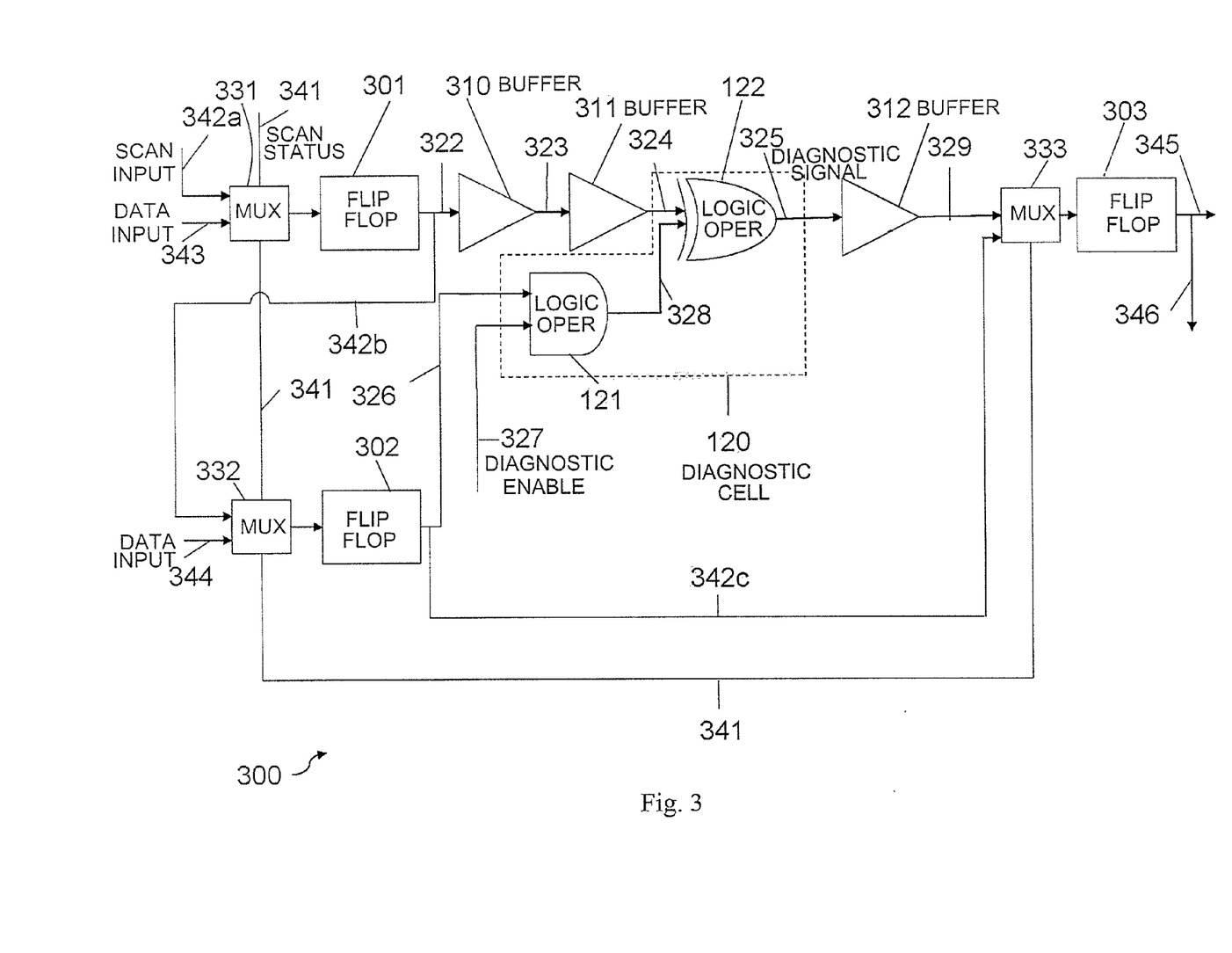
FIG. 3 is a schematic diagram of a diagnostic cell within a circuit in accordance with another embodiment of the present invention.

The schematic diagram of FIG. 3 illustrates system 300, an embodiment of the present invention, wherein the diagnosis cell 120 of FIG. 1 is implemented in a larger circuit utilizing scan chain design for test (DFT). A person of ordinary skill in the art will recognize that the elements of system 300 shown and described herein are only a portion of the circuit elements contained within a larger integrated circuit (IC) of which system 300 is a part. Many additional features may be incorporated as part of the invention as the elements shown are for exemplary purposes and are not otherwise meant to be limiting. System 300 comprises a first flip-flop 301, a second flip-flop 302, a third flip-flop 303, a first buffer 310, a second buffer 311, a third buffer 312, a first MUX 331, a second MUX 332, a third MUX 333, and a diagnosis cell 120.

In the illustrated embodiment, the diagnosis cell 120 comprises a first logic operator 121, such as the AND gate shown in FIG. 3, and a second logic operator 122, such as the XOR gate shown in FIG. 3. A person of ordinary skill in the art will understand that the first logic operator 121 and the second logic operator 122 may comprise a combination of one or more logic operators such that the selected logic operators produce a diagnostic signal 325 equivalent to that described in the diagnostic cell truth table of FIG. 2. Additionally, the above examples are provided for illustrative purposes, to further explain applications of the present invention and are not meant to limit the present invention in any manner. Other circuit elements may be used as desired for a given application.

The first logic operator 121 receives a diagnostic enable signal 327 that comprises an enable or disable value, allowing the diagnosis cell 120 to operate in diagnosis mode or function as a pass through element, depending on the status of the diagnostic enable signal 327. The first logic operator 121 is communicatively coupled to the second logic operator 122 as indicated by a first logic operator signal 328. In the illustrated embodiment, the first logic operator signal 328 comprises an invert or do not invert value instructing the second logic operator 122 to invert the buffer chain signal 324. The first logic operator signal 328 is produced in response to the receipt by the first logic operator 121 of the control signal 326, and the diagnostic enable signal 327.

In the illustrated embodiment, the second flip-flop 302 stores the control signal 326. Setting the control signal 326 to a flip-flop in the circuit allows a tester to design the test pattern to include further diagnostics based on the results of the initial test. An invert value clocked into the node represented by the second flip-flop 302 allows use of the initial test pattern to more particularly locate the failure within the IC. In the event that the test pattern returns a failing resultant pattern, the test pattern may be clocked into the IC again, and where the bit value in the initial test pattern clocked into the second flip-flop 302 comprises an invert value, the user or testing equipment may more particularly locate a failure by enabling the diagnostic cell 120 without the requirement of additional inputs to control inversion.

In the illustrated embodiment, the flip-flops in the circuit of system 300 are designed to incorporate scan chain DFT and may operate in parallel load or serial shift mode. When the circuit is in operational mode, the flip-flops are configured to operate in parallel, and the values stored in the flip-flops are latched into the next logic element in the system. When the circuit is to undergo testing, the flip-flops are configured to serially shift values into the flip-flops or serially shift values out of the flips-flops of the circuit, thus allowing the circuit to be observed at each flip-flop, i.e. during a scan chain test process it is possible to set each input value preceding a logic element and know how each logic element responded to that input.

The first MUX 331 is communicatively coupled to the first flip-flop 301, the second MUX 332 is communicatively coupled to the second flip-flop 302, and the third MUX 333 is communicatively coupled to the third flip-flop 303. The first MUX 331 receives a scan status signal 341, a first scan input signal 342a, and a first data input signal 343. The scan status signal 341 comprises a scan enable or a scan disable value instructing the first MUX 331 to include or not include the first flip-flop 301 in a scan chain within the IC, i.e., to communicatively connect the first flip-flop 301 as part of a series so that a pattern may be clocked in or out of the IC, or to communicatively connect the flip-flop 301 so that the IC may operate normally. Based on the scan status signal 341, each respective MUX controls the inclusion of a respective flip-flop in a scan chain.

In the illustrated embodiment, the first scan input signal 342a comprises a primary input, set to an input/output (I/O) pin, allowing system 300 to clock a test pattern into the flip-flops of system 300. The data input signal 343 comprises a logic signal that may be set to other elements (not shown) within the larger IC of which system 300 is a part. The second MUX 332 receives the scan status signal 341, a second scan input signal 342b, and a second data input signal 344. The second scan input signal 342b comprises the output of the first flip-flop 301. The second data input signal 344 comprises a logic signal that may be set to other elements (not shown) within the larger IC of which system 300 is a part.

The third MUX 333 receives the scan status signal 341, a third scan input signal 342c, and a third buffer signal 329. The third scan input signal 342c comprises the output of the second flip-flop 302. As described in more detail below, the first, second, and third MUXs, 331, 332, and 333, respectively, allow for implementation of a scan chain test. A person of ordinary skill in the art will recognize that the scan chain DFT system described herein is illustrated in simplified form for illustrative purposes only and is not intended to otherwise limit the scope of the invention. Other methods and devices may be used to implement a scan chain DFT system and are contemplated by the present invention.

As illustrated in FIG. 3, the first flip-flop 301 is communicatively coupled to the first buffer 310, the first buffer 310 is communicatively coupled to the second buffer 311, and the second buffer 311 is communicatively coupled to the second logic operator 122, shown in FIG. 3 as an XOR gate. The second logic operator 122 is communicatively coupled to the third buffer 312, and the third buffer 312 is communicatively coupled to the third MUX 333 such that the signal 329 produced by the third buffer 312 may be stored in the third flip-flop 303. The first buffer 310, the second buffer 311, and the third buffer 312 delay a signal between the first flip-flop 301 and the third flip-flop 303. Delaying the signal allows the portion of the IC embodied in system 300 to be synchronous with other elements of the larger IC of which system 300 is a part.

In the operative embodiment of system 300, the scan status signal 341 initially comprises a scan enable value. The first MUX 331 receives the scan status signal 341, and selects the first scan input signal 342a to pass through to the first flip-flop 301 in response. Similarly, the second and third MUXs 332 and 333, respectively, receive the scan status signal 341 and, in response, select the second and third scan input signals 342b and 342c, respectively, to pass to the second and third flip-flops 302 and 303, respectively. Thus, when the scan status signal 341 comprises a scan enable value, the first, second, and third MUXs, 331, 332, and 333, respectively, communicatively connect each flip-flop into series as part of a scan chain. When the scan input signal 342a is set to a test pattern, each clock cycle will insert one bit of the test pattern into the scan chain and advance the bit in each flip-flop into the next flip-flop in the scan chain. For example, the bit value clocked into the first flip-flop 301 will advance to the second flip-flop 302, and the bit value in the second flip-flop 302 will advance to the third flip-flop 303. Similarly, the value stored in the third flip-flop 303 will advance to the next flip-flop in the scan chain, or to a primary output or I/O pin as illustrated by signal 346. In this manner a test pattern may be clocked into system 300.

Once a scan chain test pattern has been clocked into the flip-flops of the IC, the scan status signal 341 is set to a disable value. The MUXs respectively select the data input signal to pass to the each respective flip-flop. System 300 is operated for a predetermined number of clock cycles, based on the testing parameters, allowing the system to function in operational mode with each logic element operating based on the value stored in the flip-flop preceding the particular element. A resultant bit value produced by a logic element is stored in the flip-flop following the particular element. For example, in normal operation of system 300, when the scan status signal 341 is set to a disable value, operation of the clock latches the value stored in the first flip-flop 301 into the first buffer 310. At each successive clock cycle the logic element functions and latches a value to the next element, first to the second buffer 311, then the second logic operator 122, then the third buffer 312 and finally to the third flip-flop 303. Similarly, the value stored in the second flip-flop 302, and the value stored in the third flip-flop 303 latch into the subsequent element in the IC (not shown).

After the predetermined number of clock cycles, the scan status signal 341 is again set to an enable value communicatively connecting the flips-flops of system 300 into series as described above. At each clock cycle, the bit values stored in the respective flip-flops are advanced to the next flip-flop in the series chain. In the illustrated embodiment, as each bit value is clocked into the third flip-flop 303, it is then clocked out to a primary output as shown by signal line 346, producing a resultant pattern.

The resultant pattern is compared to a good machine pattern, i.e., the resultant pattern that the IC would produce in the event that the IC functioned correctly. Where the resultant pattern compares to the good machine pattern, the IC passed the scan chain test. Where the resultant pattern does not match the good machine pattern, the IC is identified as having a failure. Because each bit value corresponds to a particular flip-flop and logic element or series of logic elements the location of the failure can be traced to a particular logic block by identifying the failed bit value, the flip-flop to which it corresponds, and the logic block that preceded the flip-flop. However, scan chain testing is unable to identify which logic element within a logic block failed. For example, where a failure is diagnosed to exist in a buffer chain such as that embodied by the first buffer 310, the second buffer 311, and the third buffer 312, the scan chain method is unable to particularly identify which particular buffer of the buffer chain failed.

In the illustrated embodiment, in the event that the resultant pattern miscompares to the good machine pattern, thus identifying a failure in the buffer chain, the initial test pattern is clocked into the scan chain again as described above, and the diagnostic enable signal is set to an enable value. At each clock cycle, the values stored in the respective flip-flops sequence through into the next element in the circuit. For example, at a rising clock edge, the value in flip-flop 301 is latched into the first buffer 310, and the value in flip-flop 302 is latched into the diagnosis cell 120 as control signal 326. As described above, control signal 326 will comprise an invert value.

The system 300 functions in operational mode for a predetermined number of clock cycles, and the diagnostic cell 120 inverts the buffer chain signal 324, in the process described above with respect to FIG. 1. The resultant pattern is clocked out and compared to the good machine pattern. Were the failure in the buffer chain to occur in the first buffer 310, or the second buffer 311, the inversion by the diagnostic cell 120 will correct the resultant pattern. Thus, in the event that the resultant pattern matches the good machine pattern, then the failure occurred prior to the diagnostic cell 120 in the first buffer 310 or the second buffer 311.

Were the failure in the buffer chain to occur in the third buffer 312, the inversion by the diagnostic cell 120 will not correct the resultant pattern. Thus, in the event that the resultant pattern does not match the good machine pattern, then the failure occurred after the diagnostic cell 120 in the third buffer 312. A person of ordinary skill in the art will recognize that additional diagnostic cells placed between each buffer or series of buffers will allow more particular identification of a failing buffer. Additionally, a person of ordinary skill in the art will recognize that the use of the diagnostic cell may be expanded to include use along any desired signal path within an integrated circuit.

Figure 4:
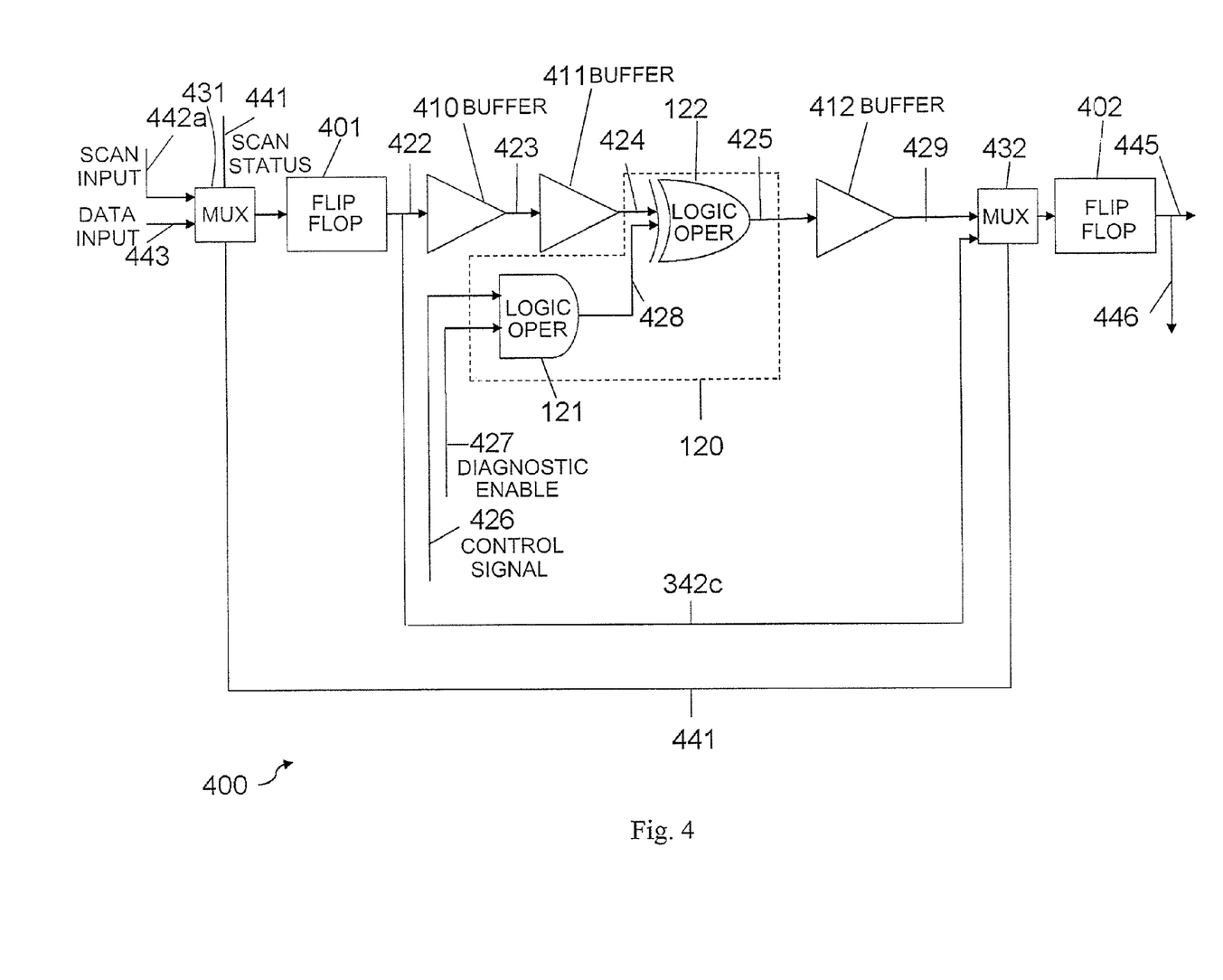
FIG. 4 is a schematic diagram of a diagnostic cell within a circuit in accordance with yet another embodiment of the present invention.

Referring now to FIG. 4, there is shown system 400, another embodiment of the present invention. System 400 comprises a first flip-flop 401, a second flip-flop 402, a first buffer 410, a second buffer 411, a third buffer 412, a first MUX 431, a second MUX 432 and a diagnosis cell 120. In the illustrated embodiment, the diagnosis cell 120 comprises a first logic operator 121, such as the AND gate shown in FIG. 4, and a second logic operator 122, such as the XOR gate shown in FIG. 4. A person of ordinary skill in the art will understand that the first logic operator 121 and the second logic operator 122 may comprise a combination of one or more logic operators such that the selected logic operators produce a diagnostic signal 429 equivalent to that illustrated in the diagnostic cell truth table of FIG. 2.

The first flip-flop 401, the second flip-flop 402, the first MUX 431, and the second MUX 432 represent portions of a scan chain used in a design for test process similar to that described in FIG. 3.

In the illustrated embodiment, the diagnosis cell 120 comprises a first logic operator 121, such as the AND gate shown in FIG. 4, and a second logic operator 122, such as the XOR gate shown in FIG. 4. A person of ordinary skill in the art will understand that the first logic operator 121 and the second logic operator 122 may comprise a combination of one or more logic operators such that the selected logic operators produce a diagnostic signal 425 equivalent to that described in the diagnostic cell truth table of FIG. 2. Additionally, the above examples are provided for illustrative purposes, to further explain applications of the present invention and are not meant to limit the present invention in any manner. Other circuit elements may be used as desired for a given application.

The first logic operator 121 receives a diagnostic enable signal 427 that comprises an enable or disable value, allowing the diagnosis cell 120 to operate in diagnosis mode or function as a pass through element, depending on the status of the diagnostic enable signal 427. The first logic operator 121 is communicatively coupled to the second logic operator 122 as indicated by a first logic operator signal 428. In the illustrated embodiment, the first logic operator signal 428 comprises an invert or do not invert value instructing the second logic operator 122 to invert the buffer chain signal 424. The first logic operator signal 428 is produced in response to the receipt by the first logic operator 121 of the control signal 426, and the diagnostic enable signal 427.

In the operative embodiment, system 400 of FIG. 4 operates in a manner similar to that of system 300 of FIG. 3, however, the control signal 426 is set to a primary input or I/O pin allowing the control signal to be switched independently of the test pattern, thus giving the tester greater flexibility while conducting the test of the larger IC of which system 400 is a part.

Figure 5:
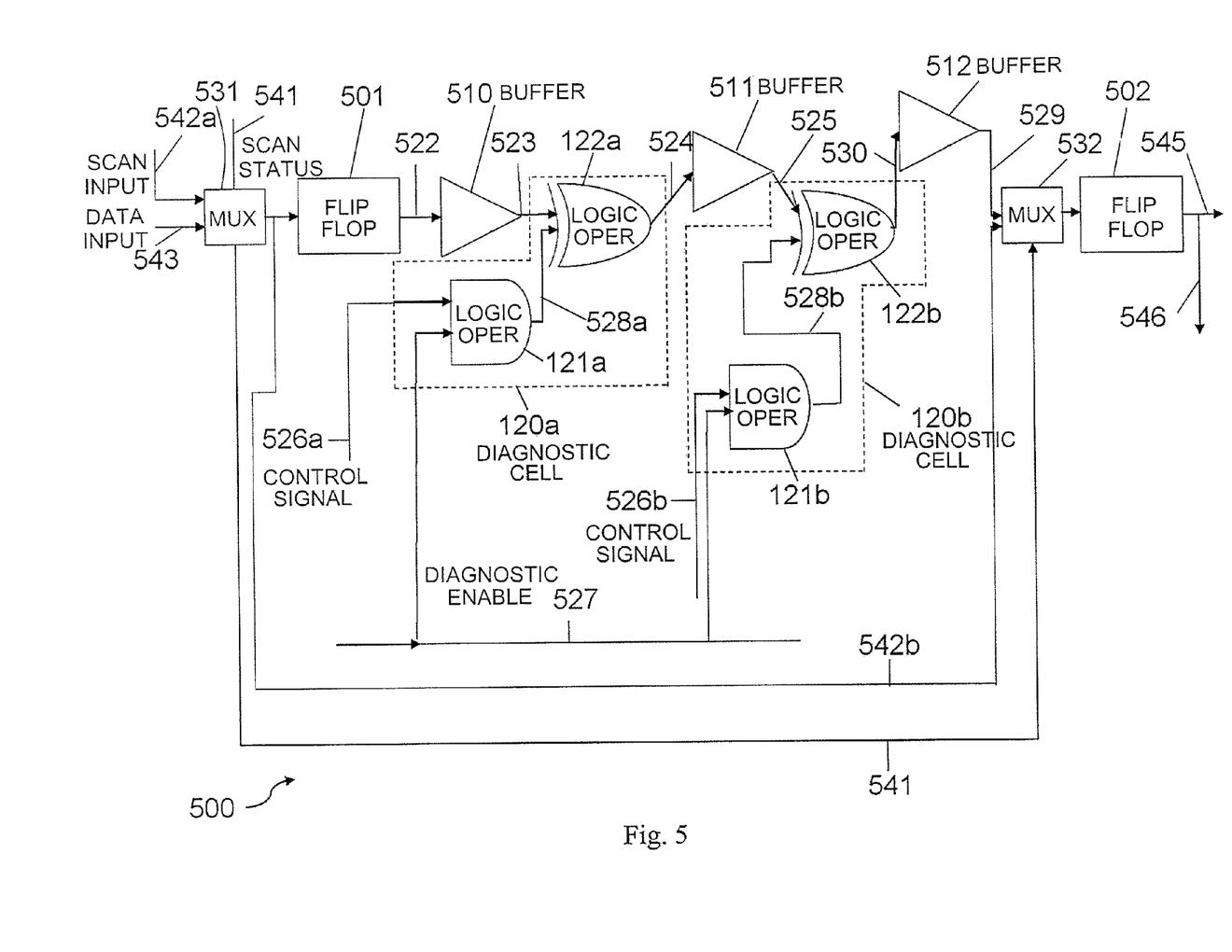
FIG. 5 is a schematic diagram of a diagnostic cell within a circuit in accordance with still another embodiment of the present invention.

FIG. 5 illustrates system 500, another embodiment of the present invention. System 500 comprises a first flip-flop 501, a second flip-flop 502, a first buffer 510, a second buffer 511, a third buffer 512, a first MUX 531, a second MUX 532, a first diagnosis cell 120a, and a second diagnosis cell 120b. A person of ordinary skill in the art will recognize that the first flip-flop 501, the second flip-flop 502, the first MUX 531, and the second MUX 532 represent portions of a scan chain used in a design for test process similar to that described in FIG. 3. A person of ordinary skill in the art will also recognize that the elements shown are only a portion of the circuit elements contained within an integrated circuit, and that many additional features may be incorporated as part of the invention; the elements shown are for exemplary purposes and are not otherwise meant to be limiting.

In the illustrated embodiment, the first diagnosis cell 120a comprises a first logic operator 121a, such as the AND gate shown in FIG. 5, and a second logic operator 122a, such as the XOR gate shown in FIG. 5. A person of ordinary skill in the art will understand that the first logic operator 121a and the second logic operator 122a may comprise a combination of one or more logic operators such that the selected logic operators produce a first diagnostic signal 524 equivalent to that described in the diagnostic cell truth table of FIG. 2.

The second diagnosis cell 120b comprises a third logic operator 121b, such as the AND gate shown in FIG. 5, and a fourth logic operator 122b, such as the XOR gate shown in FIG. 5. A person of ordinary skill in the art will understand that the third logic operator 121b and the fourth logic operator 122b may comprise a combination of one or more logic operators such that the selected logic operators produce a second diagnostic signal 529 equivalent to that described in the diagnostic cell truth table of FIG. 2.

The first flip-flop 501 is communicatively coupled to the first buffer 510, as shown by signal 522. The first buffer 510 is communicatively coupled to the second logic operator 122a, as shown by signal 523 and the second logic operator 122a is communicatively coupled to the second buffer 511 as shown by a first diagnostic signal 524, such that the first diagnostic signal 524 of the first diagnosis cell 120a latches into the second buffer 511. The second buffer 511 is communicatively coupled, as shown by signal 525, to the fourth logic operator 122b, shown in FIG. 5 as an XOR gate. The fourth logic operator 122b is communicatively coupled to the third buffer 512, and the third buffer 512 is communicatively coupled to the second flip-flop 502.

The first logic operator 121a receives a diagnostic enable signal 527 that comprises an enable or disable value, allowing the first diagnosis cell 120a to operate in diagnosis mode or function as a pass through element, depending on the status of the signal 527. The first logic operator 121a also receives a first control signal 528 that comprises an invert or do not invert value that may be communicatively connected to any primary input.

The third logic operator 121b receives the diagnostic enable signal 527 that comprises an enable or disable value, allowing the second diagnosis cell 120b to operate in diagnosis mode or function as a pass through element, depending on the status of the signal 527. As illustrated in FIG. 5, the first diagnostic cell 120a and the second diagnostic cell 120b may be enabled simultaneously by the diagnostic enable signal 527. In an alternative embodiment, the first diagnostic cell 120a and the second diagnostic cell 120b may be enabled independently by separate diagnostic enable signals. The third logic operator 121b also receives a second control signal 526b that comprises an invert or do not invert value that may be communicatively connected to any primary input.

In the operative embodiment, system 500 of FIG. 5 operates in a manner similar to that of system 300 of FIG. 3, modified as described below, however, the control signals 526a and 526b are set to a primary input or I/O pin allowing the control signals to be switched independently of the test pattern, thus giving the tester greater flexibility while conducting the test of the larger IC of which system 500 is a part.

In the illustrative operative embodiment, in the event that the buffer chain fails the scan chain test, the first diagnosis cell 120a and the second diagnosis cell 120b may be enabled. When the first and second diagnosis cells 120a and 120b, respectively, are enabled, the output of the first and second diagnosis cells 120a and 120b, respectively, may be controlled so that a failure in the IC may be located. In an exemplary operation, the first control signal 526a is set to an invert value and the second control signal 526b is set to a do not invert value. The test pattern is clocked into the flip-flops of the system as described above with respect to FIG. 3, and the system operates for a predetermined number of clock cycles, the first diagnostic cell 120a inverting the buffer chain signal 523, and the second diagnostic cell 120b bypassing the buffer chain signal 525. Following the predetermined number of clock cycles, the resultant pattern is clocked out of the flip-flops as described above with respect to FIG. 3. In the event that the resultant pattern does not miscompare with the good machine pattern, then the failure is located prior to the first diagnostic cell 120a in the first buffer 510.

In the event that the resultant pattern continues to miscompare with the good machine pattern, then the failure is located after the diagnostic cell 120a. The first control signal 526a is set to a do not invert value, and the second control signal 526b is set to an invert value. Again, the test pattern is clocked into the flip-flops of the system as described above with respect to FIG. 3, and the system operates for a predetermined number of clock cycles, the first diagnostic cell 120a bypassing the buffer chain signal 523, and the second diagnostic cell 120b inverting the buffer chain signal 525. In the event that the resultant pattern miscompares with the good machine pattern, the failure is identified to have occurred after the second diagnostic cell 120b in the third buffer 512. In the event that the resultant pattern compares with the good machine pattern, the failure is located prior to the second diagnostic cell 120b in the second buffer 511. Thus, using two diagnostic cells as illustrated in FIG. 5 allows the user to more particularly identify the location of a failure. A person of ordinary skill in the art will recognize that a plurality of diagnostic cells may be used according to the specific needs required by the tester.

Figure 6:
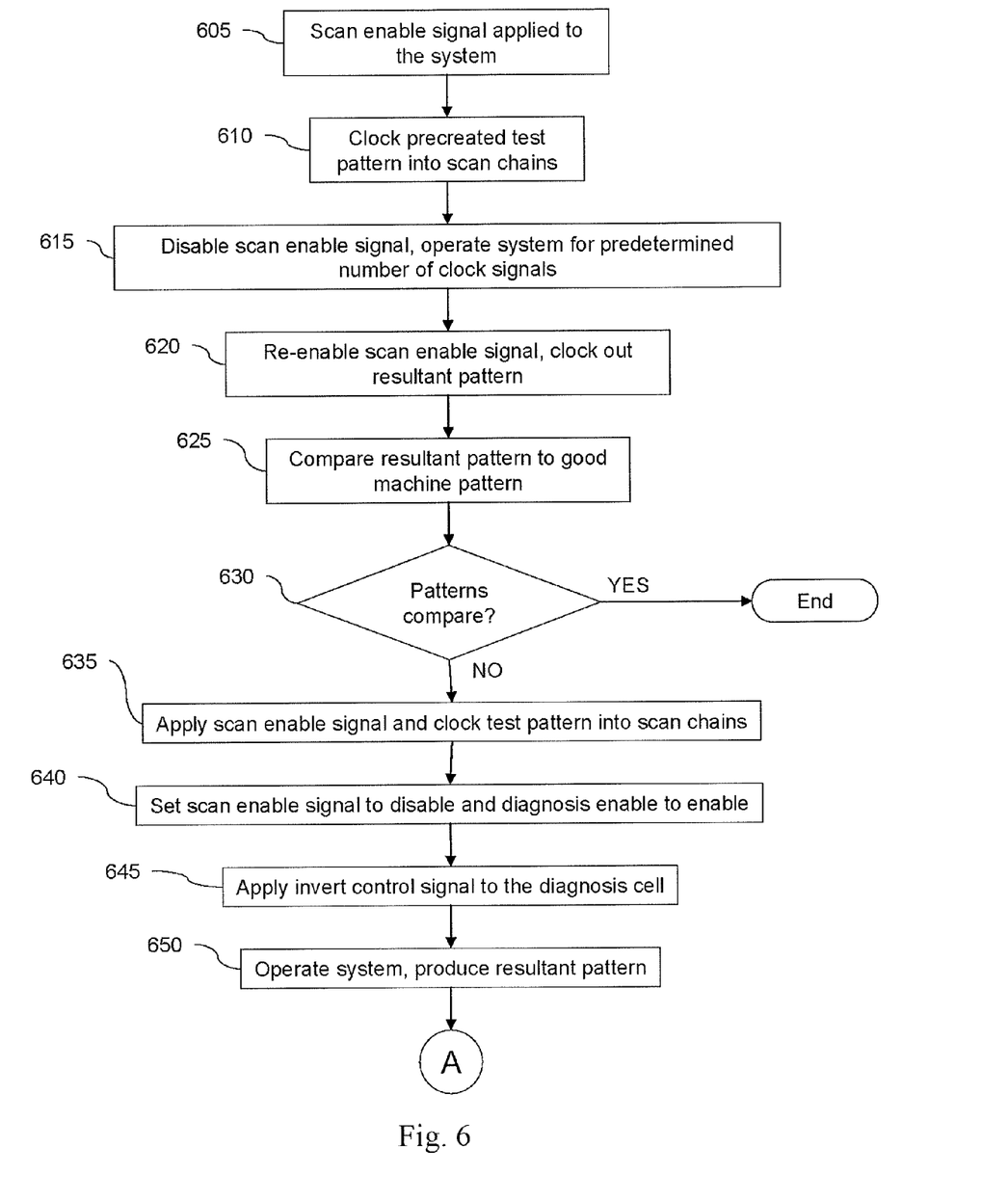
FIGS. 6 and 7 are high level flowcharts illustrating operative steps of an embodiment of the present invention.
Figure 7:
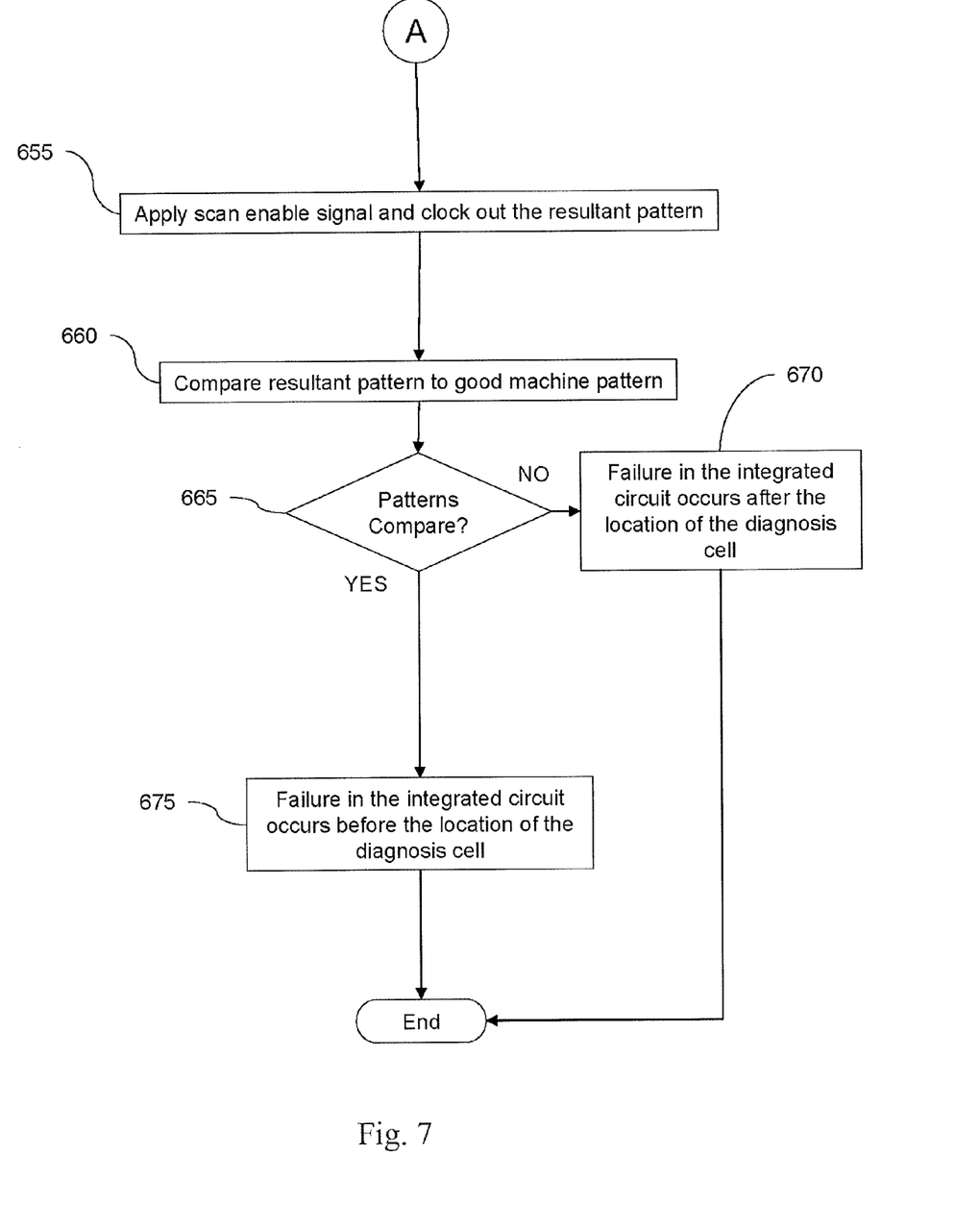

The previously described systems operate generally as described with respect to FIG. 6 and FIG. 7. FIG. 6 and FIG. 7 illustrate a high-level flow chart that depicts logical operational steps performed by, for example, system 400 of FIG. 4, which may be implemented in accordance with an embodiment. As indicated at block 605, the process begins when a scan enable signal is applied to the system, communicatively connecting all of the flip-flops of the system into a long scan chain. Next as indicated at block 610, a precreated test pattern is clocked into the scan chain.

The process continues when the scan enable signal is disabled and the system is operated for a predetermined number of clock signals, as indicated at block 615. Normal operation of the system proceeds, as indicated at block 620, by re-enabling the scan enable signal, and clocking out the resultant pattern. As indicated at block 625, the resultant pattern is then compared to the good machine pattern. In the event that the resultant pattern compares to the good machine pattern, then, as indicated at decisional block 630, the process continues on the YES path, where the process ends.

As indicated at decisional block 630, in the event that the resultant pattern miscompares with the good machine pattern, the process continues on the NO path to block 635, where the scan enable signal is applied to the system and the test pattern is clocked into the scan chain again. The system then sets the scan enable signal to disable, and the diagnosis enable signal to enable, as indicated at block 640. The process continues as shown in block 645, where an invert control signal is applied to the diagnosis cell.

The system is operated, as described at block 650, and a resultant pattern is produced in the flip-flops of the system. Next, as indicated at block 655 (FIG. 7), the system re-enables the scan enable signal and clocks out the resultant pattern. The resultant pattern is again compared to the good machine pattern, as indicated at block 660. In the event that the resultant pattern does not compare to the good machine pattern, as shown at decisional block 665, the system continues on the NO path to block 670, where the failure is identified to have occurred after the diagnostic cell. In the event that the resultant pattern compares with the good machine pattern, as indicated at decisional block 665, the process continues on the YES path to block 675, where the failure is identified to have occurred before the diagnostic cell.

In accordance with one embodiment of the present invention, an apparatus for diagnosing an integrated circuit is provided. The apparatus comprises a plurality of flip-flops, configured for scan chain design for test and a buffer chain having a plurality of buffers, the buffer chain communicatively coupled to a first flip-flop of the plurality of flip flops. The apparatus further comprises a first diagnosis cell, communicatively coupled in series with the buffer chain, configured to receive a buffer chain output signal from a first intermediate buffer in the buffer chain, a first input signal and a second input signal, and produce a diagnostic signal indicating the operational status of an integrated circuit, and a second intermediate buffer configured to receive the diagnostic signal and transmit the diagnostic signal to a second flip-flop of the plurality of flip-flops.

In accordance with another embodiment of the present invention, an apparatus for diagnosing integrated circuit is provided. The apparatus comprises a diagnostic cell comprising a first logic operator coupled to a second logic operator. The first logic operator is configured to receive a first input signal and a second input signal, and in response, produce a first logic operator output signal. The second logic operator is configured to receive a third input signal, and the first logic operator output signal, and in response produce a diagnostic signal indicating the operational status at a given location in the integrated circuit.

In accordance with yet another embodiment of the present invention, a method for diagnosing an integrated circuit is provided. The method comprises testing an integrated circuit using a scan chain test pattern as part of a scan chain design for test methodology, and in the event the test indicates that the integrated circuit does not perform as designed, enabling one or more diagnostic cells at given locations within the integrated circuit. The method continues by re-testing an integrated circuit using the scan chain test pattern, the one or more diagnostic cells selectively inverting an operational signal within the integrated circuit, and identifying the operational status at the given location within the integrated circuit based on the re-test of the integrated circuit.

A person of ordinary skill in the art will recognize that the apparatus and process described by the present invention will provide a means by which to diagnosis and particularly locate failures within a delay/buffer chain that is compatible with present testing systems, most notably the common automatic test pattern generation (ATPG) systems without hindering the normal operation of the systems.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for diagnosing an integrated circuit comprising:
    testing the integrated circuit using a scan chain test pattern;
    if the testing indicates that the integrated circuit does not perform as designed, enabling one or more diagnostic cells at one or more locations within the integrated circuit;
    re-testing the integrated circuit using the scan chain test pattern, the one or more diagnostic cells selectively inverting an operational signal within the integrated circuit; and
    identifying an operational status at a first location of the one or more locations based on the re-test of the integrated circuit.

2. The method of claim 1, wherein the testing the integrated circuit comprises:
    setting a scan enable signal to enable, thus communicatively coupling a plurality of flip-flops into a scan chain;
    clocking the scan chain test pattern into the scan chain;
    setting the scan enable signal to disable, thus communicatively coupling the plurality of flip-flops for normal operation in the integrated circuit;
    operating the integrated circuit for a predetermined number of clock cycles;
    setting the scan enable signal to enable, thus communicatively coupling the plurality of flip-flops into the scan chain;
    clocking a first resultant pattern out of the scan chain;
    comparing the first resultant pattern to an expected pattern; and
    if the first resultant pattern differs from the expected pattern, identifying a bit location where the first resultant pattern differs from the expected pattern.

3. The method of claim 2, wherein the identifying the operational status at the first location of the one or more locations comprises:
    if a re-test first resultant pattern differs from an expected pattern, identifying a first integrated circuit element along a signal path between a particular diagnostic cell of the one or more diagnostic cells and a first flip-flop corresponding to a bit location where the re-test first resultant pattern differs from the expected pattern as not operating as designed; and
    if the re-test first resultant pattern is the same as the expected pattern, identifying a second integrated circuit element along the signal path between a second flip-flop corresponding to the bit location of the scan chain test pattern corresponding to the first flip-flop and the particular diagnostic cell of the one or more diagnostic cells as not operating as designed.

4. The method of claim 1, wherein the enabling the one or more diagnostic cells comprises:
    identifying a particular diagnostic cell of the one or more diagnostic cells, the particular diagnostic cell being communicatively coupled along a signal path between a first flip-flop of the integrated circuit storing a bit value of the scan chain test pattern and a second flip-flop of the integrated circuit corresponding to a bit location where a first resultant pattern differs from an expected pattern; and
    setting a diagnostic cell enable signal of the particular diagnostic cell to an enable state, thereby causing the particular diagnostic cell to operate.

5. The method of claim 1, wherein the inverting the operational signal comprises:
    setting a diagnosis control signal of a particular diagnostic cell of the one or more diagnostic cells to an inverted state, thereby causing the diagnostic cell to invert the operational signal; and
    operating the integrated circuit for a predetermined number of clock cycles, thereby producing a re-test resultant pattern.

6. The method of claim 1, wherein one of the one or more diagnostic cells comprises a first logic operator communicatively coupled to a second logic operator, the first logic operator configured to receive a first input signal and a second input signal, and in response, produce a first logic operator output signal, the second logic operator configured to receive the scan chain test pattern and the first logic operator output signal, and in response produce a diagnostic signal.

7. The method of claim 6, further comprising reading a resulting pattern based on the diagnostic signal.

8. A method for diagnosing an integrated circuit comprising:
    enabling one or more diagnostic cells at one or more locations within an integrated circuit by providing a diagnostic enable signal to each of the one or more diagnostic cells;
    testing the integrated circuit, the testing comprising:
        communicatively coupling a plurality of flip-flops into a scan chain by providing an enabled scan enable signal to the plurality of flip-flops;
        providing a scan chain test pattern to a first buffer chain connected to at least one of the plurality of flip-flops;
        communicatively coupling the plurality of flip-flops for normal operation in the integrated circuit by providing a disabled scan enable signal to the plurality of flip-flops; and
        communicatively coupling the plurality of flip-flops into a scan chain after operating the plurality of flip-flops in normal operation; and
    identifying an operational status at a first location of the one or more locations based on the testing of the integrated circuit.

9. The method of claim 8, wherein the testing further comprises selectively inverting an operational signal within the integrated circuit by transmitting an invert signal to the one or more diagnostic cells.

10. The method of claim 8, wherein the providing a diagnostic enable signal comprises providing a first diagnostic enable signal in an enable state to a first one of the one or more diagnostic cells and providing a second diagnostic enable signal in a disable state to a second one of the one or more diagnostic cells.

11. The method of claim 8, wherein identifying an operational status comprises:
reading a first resultant pattern out of the scan chain;
comparing the first resultant pattern to an expected pattern; and
if the first resultant pattern differs from the expected pattern, identifying a bit location where the first resultant pattern differs from the expected pattern.

12. The method of claim 11, the identifying a bit location comprises:
identifying a particular diagnostic cell of the one or more diagnostic cells, the particular diagnostic cell being communicatively coupled along a signal path between a first flip-flop of the integrated circuit storing a bit value of the scan chain test pattern and a second flip-flop of the integrated circuit corresponding to a bit location where a first resultant pattern differs from an expected pattern; and
setting a diagnostic cell enable signal of the particular diagnostic cell to an enable state, thereby causing the particular diagnostic cell to operate.

13. The method of claim 8, wherein the identifying the operational status at the first location of the one or more locations comprises:
if a resultant pattern differs from an expected pattern, identifying a first integrated circuit element along a signal path between a particular diagnostic cell of the one or more diagnostic cells and a first flip-flop corresponding to a bit location where the resultant pattern differs from the expected pattern as not operating as designed; and
if the resultant pattern is the same as the expected pattern, identifying a second integrated circuit element along the signal path between a second flip-flop corresponding to the bit location of the scan chain test pattern feeding the first flip-flop and the particular diagnostic cell of the one or more diagnostic cells as not operating as designed.

14. A method of testing an integrated circuit comprising:
activating a plurality of flip-flops by setting a scan enable signal and communicatively coupling the plurality of flip-flops into a scan chain in response to the set scan enable signal;
providing a scan chain test pattern to an input of a first flip-flop of the plurality of flip-flops, the first flip-flop providing the scan chain test pattern to the input of a first buffer chain different from the plurality of flip-flops, the first buffer chain providing a buffer chain signal to an input of a first diagnostic cell of a plurality of diagnostic cells; and
reading a resultant pattern from the first diagnostic cell, the first diagnostic cell generating the resultant pattern indicating an operational status of the integrated circuit based on at least the buffer chain output signal and a first input signal to the first diagnostic cell.

15. The method of claim 14, wherein the diagnostic cell provides the resultant pattern to an input of a second buffer chain and wherein the second buffer chain provides the resultant pattern to the input of a second flip-flip of the plurality of flip-flops, and wherein the reading the resultant pattern comprises reading the resultant pattern from a second flip-flop of the plurality of flip-flops.

16. The method of claim 15, further comprising:
comparing the resultant pattern to an expected pattern; and
if the resultant pattern differs from the expected pattern, identifying a bit location where the resultant pattern differs from the expected pattern.

17. The method of claim 16, wherein the identifying a bit location comprises identifying a particular diagnostic cell of the one or more diagnostic cells, the particular diagnostic cell being communicatively coupled along a signal path between the first flip-flop and the second flip-flop corresponding to a bit location where a first resultant pattern differs from an expected pattern.

18. The method of claim 14, further comprising providing a diagnostic enable signal to each of the one or more diagnostic cells prior to the providing the scan chain test pattern.

19. The method of claim 14, wherein the first diagnostic cell comprises a first logic operator communicatively coupled to a second logic operator, the first logic operator configured to receive a first input signal and a second input signal, and in response, produce a first logic operator output signal, the second logic operator configured to receive the buffer chain signal and the first logic operator output signal, and in response produce a diagnostic signal; and
wherein the reading the resultant pattern comprises reading a pattern based on the diagnostic signal.

20. The method of claim 14, wherein each one a plurality of multiplexers has an output connected to an input of respective ones of the plurality of flip-flops, and wherein the activating the plurality of flip-flops comprises switching a signal transmitted by each of the plurality of multiplexers from a data input to a scan chain test pattern input.

* * * * *